United States Patent
Arai et al.

(10) Patent No.: US 12,340,931 B2
(45) Date of Patent: Jun. 24, 2025

(54) COIL COMPONENT, CIRCUIT BOARD ARRANGEMENT, ELECTRONIC DEVICE AND METHOD OF MANUFACTURING COIL COMPONENT

(71) Applicant: TAIYO YUDEN CO., LTD., Tokyo (JP)

(72) Inventors: Yasuhiro Arai, Takasaki (JP); Tomoo Kashiwa, Takasaki (JP)

(73) Assignee: TAIYO YUDEN CO., LTD, Tokyo (JP)

( * ) Notice: Subject to any disclaimer, the term of this patent is extended or adjusted under 35 U.S.C. 154(b) by 291 days.

(21) Appl. No.: 18/186,854

(22) Filed: Mar. 20, 2023

(65) Prior Publication Data

US 2023/0326655 A1 Oct. 12, 2023

(30) Foreign Application Priority Data

Mar. 30, 2022 (JP) .................................. 2022-057139

(51) Int. Cl.
| | |
|---|---|
| *H01F 27/255* | (2006.01) |
| *H01F 17/04* | (2006.01) |
| *H01F 27/29* | (2006.01) |
| *H01F 41/04* | (2006.01) |
| *H05K 1/02* | (2006.01) |
| *H05K 1/18* | (2006.01) |

(52) U.S. Cl.
CPC ........... *H01F 27/255* (2013.01); *H01F 27/29* (2013.01); *H01F 41/04* (2013.01); *H05K 1/181* (2013.01); *H05K 2201/1003* (2013.01)

(58) Field of Classification Search
CPC .......... H05K 2201/1003; H05K 1/0271; H01F 17/04; H01F 2017/048; H01F 27/255
See application file for complete search history.

(56) References Cited

U.S. PATENT DOCUMENTS

| | | | |
|---|---|---|---|
| 2018/0308628 A1 | 10/2018 | Muneuchi | |
| 2021/0343476 A1* | 11/2021 | Nomura | .................... H01G 4/30 |
| 2022/0139609 A1* | 5/2022 | Inui | ......................... H01F 17/04 |
| | | | 336/192 |

FOREIGN PATENT DOCUMENTS

WO      2017115604 A1     7/2017

\* cited by examiner

*Primary Examiner* — Sherman Ng
(74) *Attorney, Agent, or Firm* — Law Office of Katsuhiro Arai

(57) ABSTRACT

A coil component includes a base body, a conductor inside the base body, and an external electrode electrically connected to the conductor. The base body has metal magnetic particles bonded by a first resin, and has a first surface that faces a mounting board, and a second surface adjacent to the first surface. The external electrode includes a first conductive resin layer on the first surface, which is made of a material that contains a second resin and first metal particles. The external electrode includes a second conductive resin layer on the second surface, which is made of a material that contains a third resin and second metal particles. A content rate of the third resin is smaller than a content rate of the second resin. The external electrode includes a metal layer covering the first and second conductive resin layers.

11 Claims, 8 Drawing Sheets

COIL COMPONENT, CIRCUIT BOARD ARRANGEMENT, ELECTRONIC DEVICE AND METHOD OF MANUFACTURING COIL COMPONENT

FIELD OF THE INVENTION

This invention relates to coil components, circuit board arrangements, electronic devices, and methods of manufacturing the coil components.

DESCRIPTION OF THE RELATED ART

Electronic devices, such as communication devices and in-vehicle electronic devices, have been enhanced in performance, and electronic components of the electronic devices are required to be miniaturized and possess high performance. Further, as use of electronic components is expanding, electronic components satisfying various requirements are in demand. In particular, demands of the use environment are increasing, e.g., electronic components capable of coping with extreme environments (e.g., high temperature and high humidity) are required.

Downsizing of electronic components is required in coil components. As a typical example, a multilayer body is formed by using a lamination process in the same manner as a multilayer capacitor, and a so-called 0402 coil component (having a size of 0.040"×0.020") is realized. On the other hand, a coil component made by winding an insulated conductor (insulated wire) is late in downsizing, and external electrodes are one cause that hinders downsizing.

For example, an external electrode of a multilayer inductor is made by combining a plating layer with a sintered electrode layer such that the thickness of the external electrode is relatively thin. The electrode layer is made without including a material other than a metal, so that resistance is low even if the thickness is thin. On the other hand, there is a metal composite-type coil component in which a metal magnetic material is compacted in a resin. The metal composite-type coil component is a typical coil component constituted by a wound wire, and has recently expanded in applications.

PCT International Publication WO 2017/115604 discloses an external electrode provided on a resin compact (component body) containing a metal magnetic powder. To provide the external electrode, a conductive paste in which metal grains such as Au and Ag are dispersed in a resin is applied on the component body together with a plating layer. This is because, unlike in a process of making a multilayer inductor, the component body (resin compact) is compacted in a resin, i.e., electrode layers requiring sintering cannot be used.

SUMMARY OF THE INVENTION

When a conductive paste is applied onto the base body to make external electrodes on the base body, the conductive paste is required to contain a resin at a certain content rate in order to ensure adhesion between the component body and the conductive paste. It is also necessary for the conductive paste to have a certain thickness in order to compensate for an increase in resistance due to the presence of the resin. These points are different from electrode layers to be sintered in an external electrode, when compared to an external electrode in which conductive paste is used. In addition, there are other process restrictions. In any case, when a metal composite-type coil component is manufactured, external electrodes are one of the restrictions in downsizing.

Further, when the size of the coil component should be small, it is necessary to increase the volume of the component body (resin compact) as much as possible, and therefore, external electrodes should be thin, the surface(s) on which the external electrodes are provided is reduced to be one or two surfaces of the component body. On the other hand, when the surface(s) on which the external electrodes are provided is reduced to one or two surfaces, it results in a decrease in the contact area between the external electrodes and the component body. Thus, it is necessary to pay careful attention to both thinning of the external electrodes and good adhesion between the external electrodes and the component body.

A purpose of the present invention is to reduce stress generated at an external electrode that would otherwise degrade adhesion between the external electrode and the component body, thereby ultimately reducing the size of the coil component.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as in the appended drawings.

To achieve these and other advantages and in accordance with the purpose of the present invention, as embodied and broadly described, in one aspect, the present disclosure provides a coil component which includes a magnetic base body, a conductor, and an external electrode. The magnetic base body includes metal magnetic particles bonded together by a first resin. The magnetic base body has a first surface that faces a board when the coil component is mounted on the board, and has a second surface that is immediately adjacent to the first surface. The conductor is provided inside and/or on a surface of the magnetic base body. The external electrode is electrically connected to the conductor. The external electrode includes a first conductive resin layer provided on the first surface of the magnetic base body. The first conductive resin layer is made of a conductive material that contains a second resin and first metal particles. The external electrode also includes a second conductive resin layer provided on the second surface of the magnetic base body. The second conductive resin layer is made of a conductive material that contains a third resin and second metal particles. A content rate of the third resin contained in the second conductive resin layer is smaller than a content rate of the second resin contained in the first conductive resin layer. The external electrode also includes a metal layer that covers the first conductive resin layer and the second conductive resin layer.

The first conductive resin layer may be thicker than the second conductive resin layer.

A content rate of the second resin in the first conductive resin layer may be 50 vol % or more.

An average length of longest portions of the first metal particles in the first conductive resin layer may be greater than an average length of longest portions of the second metal particles in the second conductive resin layer.

The first conductive resin layer may have voids, the second conductive resin layer may have voids, and a volume rate of the voids in the second conductive resin layer may be greater than a volume rate of voids in the first conductive resin layer.

The second conductive resin layer may be separated into a plurality of portions when viewed in at least one cross section taken in a thickness direction of the second conductive resin layer.

A portion of the second conductive resin layer may extend to the first surface and may cover a portion of the first conductive resin layer.

The second conductive resin layer may extend over the entire second surface and may extend to ridges (edges) of the second surface.

The magnetic base body may have a third surface, which is a surface opposite to the first surface. A portion of the second conductive resin layer may extend to the third surface.

According to another aspect of the present invention, there is provided a circuit board arrangement that includes any of the above-described coil components, and a board on which the coil component is mounted.

According to still another aspect of the present invention, there is provided an electronic device that includes the circuit board arrangement.

According to yet another aspect of the present invention, there is provided a method of manufacturing any of the above-described coil components. The method includes forming a first conductive resin layer with a first conductive paste. The first conductive paste contains a resin and metal particles. The method also includes forming a second conductive resin layer with a second conductive paste. The second conductive paste contains a resin and metal particles, and a content rate of the resin contained in the second conductive paste is smaller than a content rate of the resin contained in the first conductive paste. The method also includes forming the metal layer.

According to the present invention, it is possible to reduce stress caused by the external electrode.

DETAILED DESCRIPTION OF EMBODIMENTS

The following is a detailed description of embodiments of the invention with reference to the accompanying drawings. The following embodiments are not intended to limit the invention, and not all of the combinations of features described in the embodiments are essential for the configuration of the invention. The configuration of the embodiments may be modified or changed if necessary depending on the specifications of the device to which the invention is applied and various conditions (conditions of use, environment of use, etc.).

The technical scope of the invention is defined by the claims and is not limited by the following individual embodiments. The drawings used in the following description may differ in scale and shape from the actual structure in order to make each configuration easier to understand. Parts, elements, and components shown in one of the drawings may be referred to in the description of other drawings.

Structure of Coil Component

Figure 1:
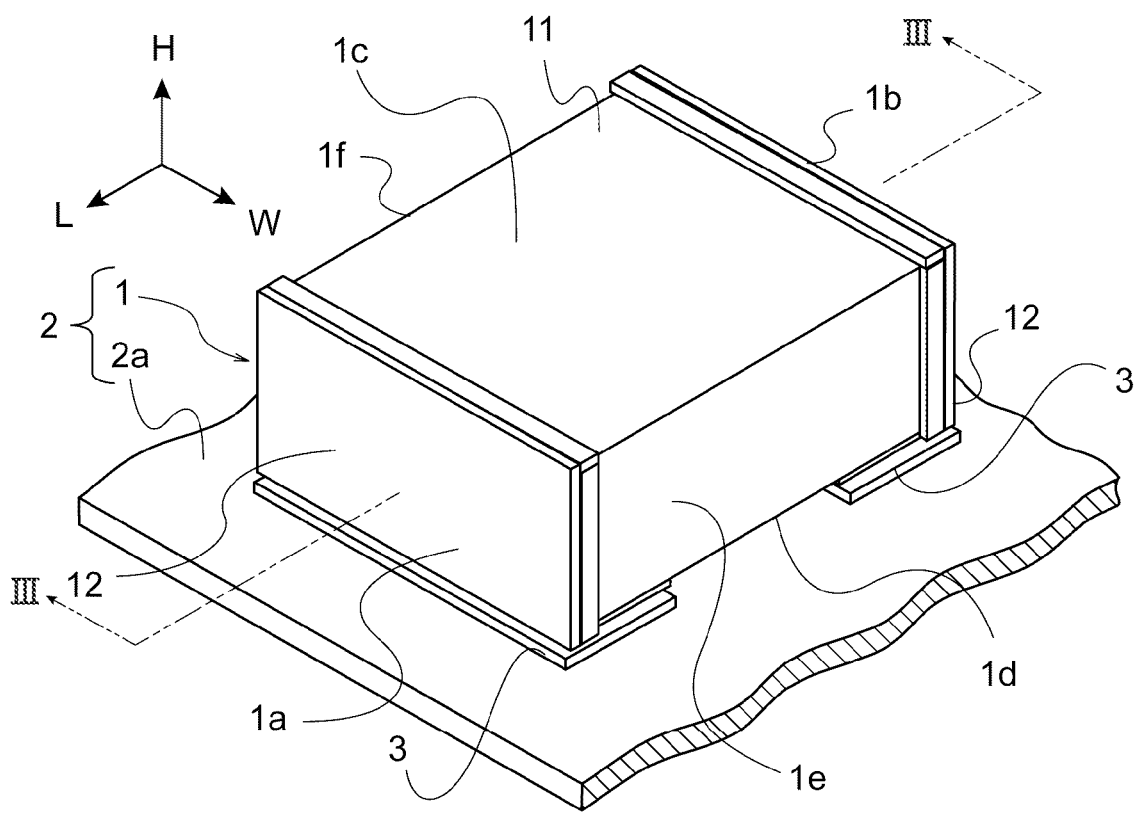
FIG. 1 is a perspective view of a coil component according to an embodiment of the present invention.

Referring to FIG. 1, a coil component 1 according to an embodiment of the present invention will be described.

Figure 2:
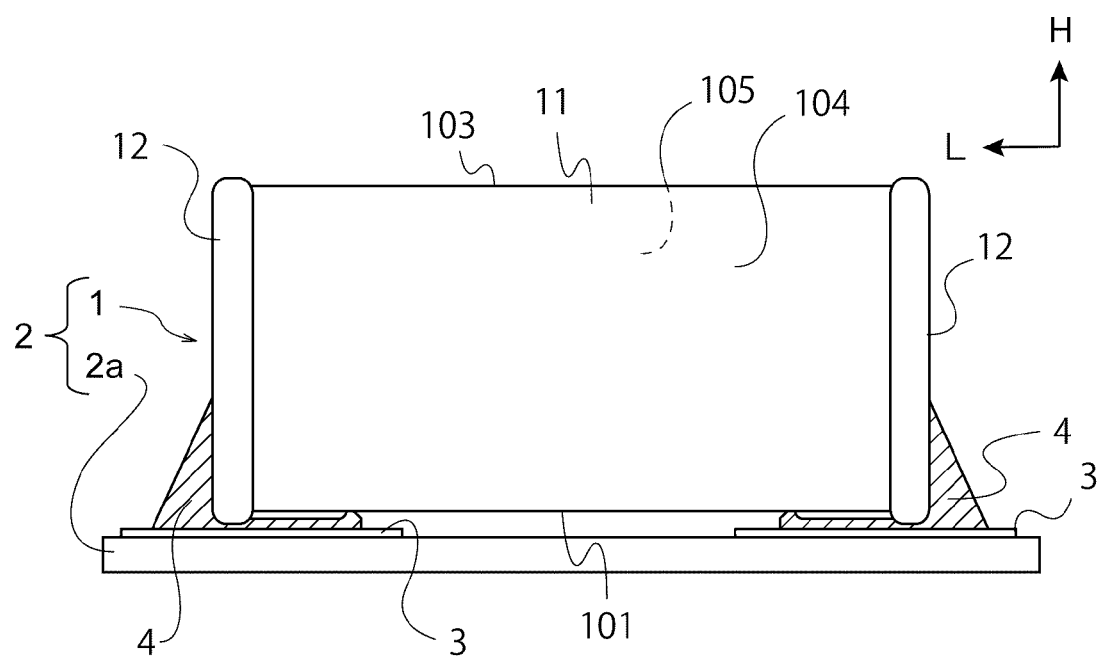
FIG. 2 is a front view of the coil component shown in FIG. 1.

The coil component 1 is mounted on a board 2a. For example, two land portions 3 are provided on the board 2a. The coil component 1 has one magnetic base body (element body) 11 and two external electrodes 12. The coil component 1 is mounted on the board 2a as the two external electrodes 12 are joined to the two land portions 3, respectively, by solder 4 (FIG. 2). A circuit board arrangement 2 according to this embodiment includes the coil component 1 and the board 2a on which the coil component 1 is mounted. The circuit board arrangement 2 is provided in various electronic devices. Exemplary electronic devices that include the circuit board arrangement 2 may be an electric component of an automobile, a server, a board computer (tablet), and various other electronic devices.

In this specification, unless the context otherwise requires, the description of directions is based on the "L-axis" direction, the "W-axis" direction, and the "H-axis" direction in FIG. 1. The L-axis direction is referred to as the length direction, the W-axis direction is referred to as the width direction, and the H-axis direction is referred to as the height direction. The height direction may also be referred to as the thickness direction of the coil component 1.

The coil component 1 has a rectangular parallelepiped shape. That is, the coil component 1 has a first end face (left face) 1a and a second end face (right face) 1b at opposite ends in the length direction, a first main face (top face) 1c and a second main face (bottom face) 1d at opposite ends in the height direction, and a front face 1e and a rear face 1f at opposite ends in the width direction.

The dimensions of the rectangular parallelepiped-shaped coil component 1 are such that the length is in a range of, for example, 1 mm to 5 mm, the width is in a range of, for example, 0.5 mm to 4.5 mm, and the height is in a range of, for example, 0.4 mm to 3.5 mm. In addition, the height of the coil component 1 is smaller than the length of the coil component 1, and the height of the coil component 1 is smaller than the width of the coil component 1.

The first end face 1a, the second end face 1b, the first main face 1c, the second main face 1d, the front face 1e and the rear face 1f of the coil component 1 may be flat surfaces or curved surfaces. The rectangular parallelepiped shape of the coil component 1 has eight corners, and twelve ridges (edges) that connect the eight corners, respectively. The eight corners and twelve ridges of the coil component 1 may be rounded.

It should be noted a part of the first end face 1a, second end face 1b, first main face 1c, second main face 1d, front face 1e, and rear face 1f of the coil component 1 may be curved and/or the corners and ridges of the coil component 1 may be rounded, but such a shape is also referred to as a rectangular parallelepiped shape in this specification. In other words, when "rectangular parallelepiped" and "rectangular" are used herein, they do not mean rectangular parallelepiped and rectangular in the strict mathematical sense.

Figure 3:
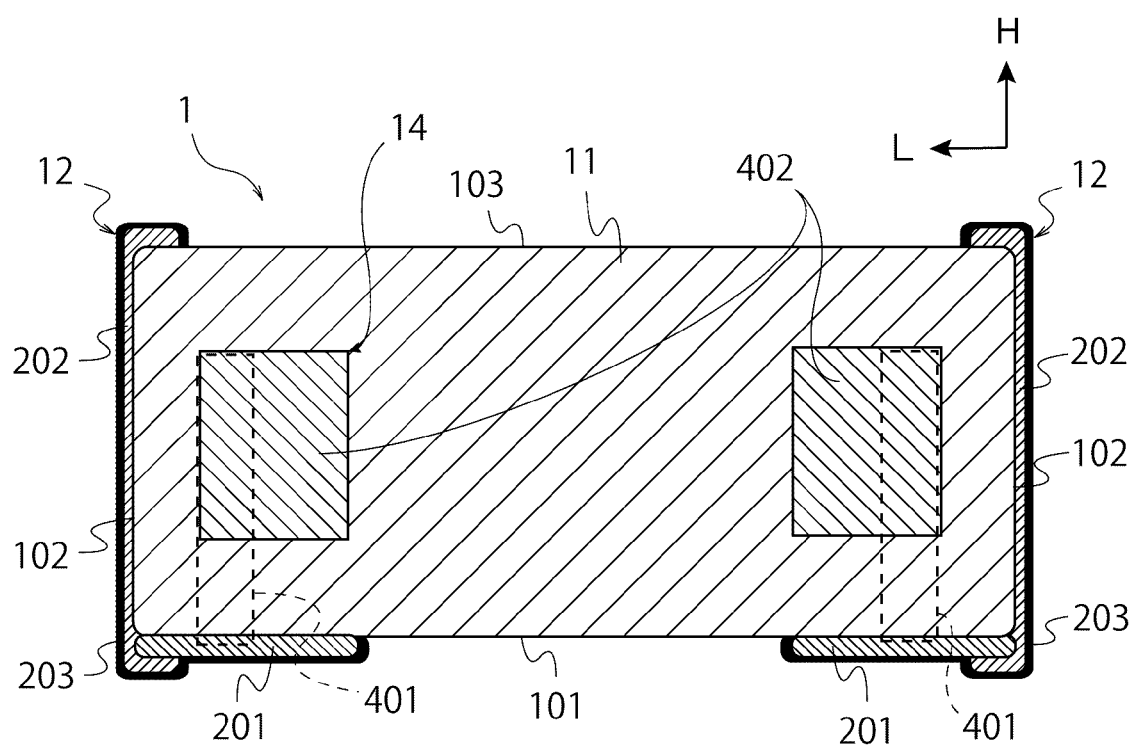
FIG. 3 is a cross-sectional view of the coil component shown in FIG. 1.

The coil component 1 includes the magnetic base body (element body) 11 and the external electrodes 12. The coil component 1 also has a conductor 14 (FIG. 3) in the magnetic base body 11. It should be noted that the conductor may be provided on the magnetic base body 11. The magnetic base body 11 may be called a drum core if the conductor is wound on the surface of the magnetic base body 11. In this embodiment, the base body 11 has a built-in conductor 14, i.e., the conductor 14 is disposed inside the magnetic base body 11, as shown in FIG. 3.

The magnetic base body 11 is an insulator containing a magnetic material. The magnetic base body 11 may contain a 95 wt % or more of a metallic magnetic material, a 1 wt % or more of a resin, and other components. The metallic magnetic material is a metal magnetic particle containing Fe, Ni, or Co, and the metal magnetic particle may contain Fe, Ni, and Co together with any of Si, Cr, Al, B, and P, or a plurality of Si, Cr, Al, B, and P.

The magnetic base body 11 may be formed of a combination of a plurality of types of metal magnetic particles, and may include a ceramic material and a glass material. The magnetic base body 11 is formed by joining metal magnetic particles with a resin. The metal magnetic particles may be subjected to an insulation treatment, or insulation may be imparted by the presence of the resin.

FIG. 2 is a front view of the coil component 1 shown in FIG. 1. FIG. 3 is a cross-sectional view taken along the line III-III shown in FIG. 1. Hereinafter, description will be given with reference to FIGS. 1 to 3.

The magnetic base body 11 has a rectangular parallelepiped shape. The base body 11 has the end surfaces 102 at opposite ends in the length direction, has a bottom surface 101 at one end in the height direction, has an upper surface 103 at the other end in the height direction, and has a front surface 104 and a rear surface 105 at opposite ends in the width direction. The bottom surface 101 is a surface that will face the board 2a when the coil component 1 is mounted on the board 2a.

The conductor 14 is made of a metal material having excellent conductivity. The metal material for the conductors 14 includes, for example, one or more of Cu, Al, Ni, and Ag, or an alloy containing any of these metals. An insulating coating may be provided on the surface of the conductor 14. A sole conductor 14 may be provided for the sole magnetic base body 11 as shown in FIG. 3, or a plurality of conductors 14 may be provided for the sole magnetic base body 11.

The conductor 14 shown in FIG. 3 includes a winding part 402 formed by a wound conductive wire, and two lead portions 401 drawn out from the winding part 402. The two lead portions 401 are connected to the two external electrodes 12, respectively. As understood from FIG. 3, the winding plane of the winding part 402 is parallel to the top surface 103 and bottom surface 101 of the base body 11. Thus, the conductor 14 (or the winding part 402) has a so-called horizontal winding structure (a horizontally-aligned winding structure with a vertical winding axis). Alternatively, the winding part 402 of the conductor 14 may have a so-called vertical winding structure in which the winding plane of the conductive wire is parallel to the end surfaces 102 of the magnetic base body 11.

The coil component 1 includes the left external electrode 12 over the left end face 1a and the right external electrode 12 over the right end face 1b. The left external electrode 12 extends onto an immediately adjacent area of the bottom surface 101 of the magnetic base body 11 from the left end surface 102. The right external electrode 12 extends onto an immediately adjacent area of the bottom surface 101 from the right end surface 102. The end surfaces 102 are surfaces immediately adjacent to the bottom surface 101, and extend in a direction perpendicular to the board 2a when the coil component 1 is mounted on the board 2a. As described above, the external electrodes 12 are joined to the land portions 3 on the board 2a by the solder 4.

The left external electrode 12 extends over the entirety of the left end surface 102, and the right external electrode 12 extends over the entirety of the right end surface 102. The left external electrode 12 extends over all the ridges (edges) of the left end surface 102, and also extends onto the top surface 103. The right external electrode 12 extends over all the ridges of the right end surface 102, and also extends onto the top surface 103. That is, the left external electrode 12 extends over a certain area of the bottom surface 101, the entire area of the left end surface 102, and a certain area of the upper surface 103, and the right external electrode 12 extends over a certain area of the bottom surface 101, the entire area of the right end surface 102, and a certain area of the top surface 103. Further, the left external electrode 12 extends over a certain area of the front surface 104 from the left end surface 102 and a certain area of the rear surface 105 from the left end surface 102. The right external electrode 12 extends over a certain area of the front surface 104 from the right end surface 102 and a certain area of the rear surface 105 from the right end surface 102. Unlike a so-called five-sided external electrode, the left external electrode 12 shown in FIG. 1 has a narrow portion on the upper surface 103 along the upper left ridge, a narrow portion on the front surface 104 along the front left vertical ridge, and a narrow portion on the rear surface 105 along the rear left vertical ridge, and the right external electrode 12 has a narrow portion on the upper surface 103 along the upper right ridge, a narrow portion on the front surface 104 along the front right vertical ridge, and a narrow portion on the rear surface 105 along the rear right vertical ridge. Each of the narrow portions does not spread on the corresponding surface but extends in a small area immediately adjacent and along the corresponding ridge of the end surface 102.

Figure 4:
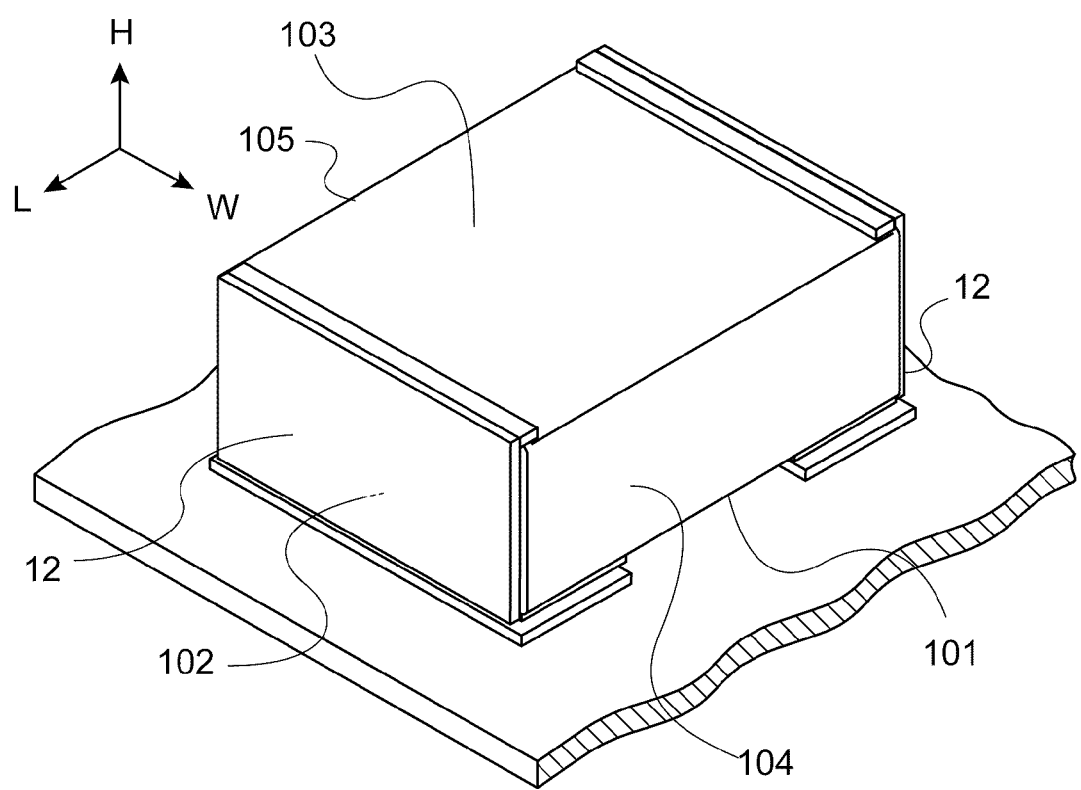
FIG. 4 is a perspective view showing a modification to an external electrode.
Figure 5:
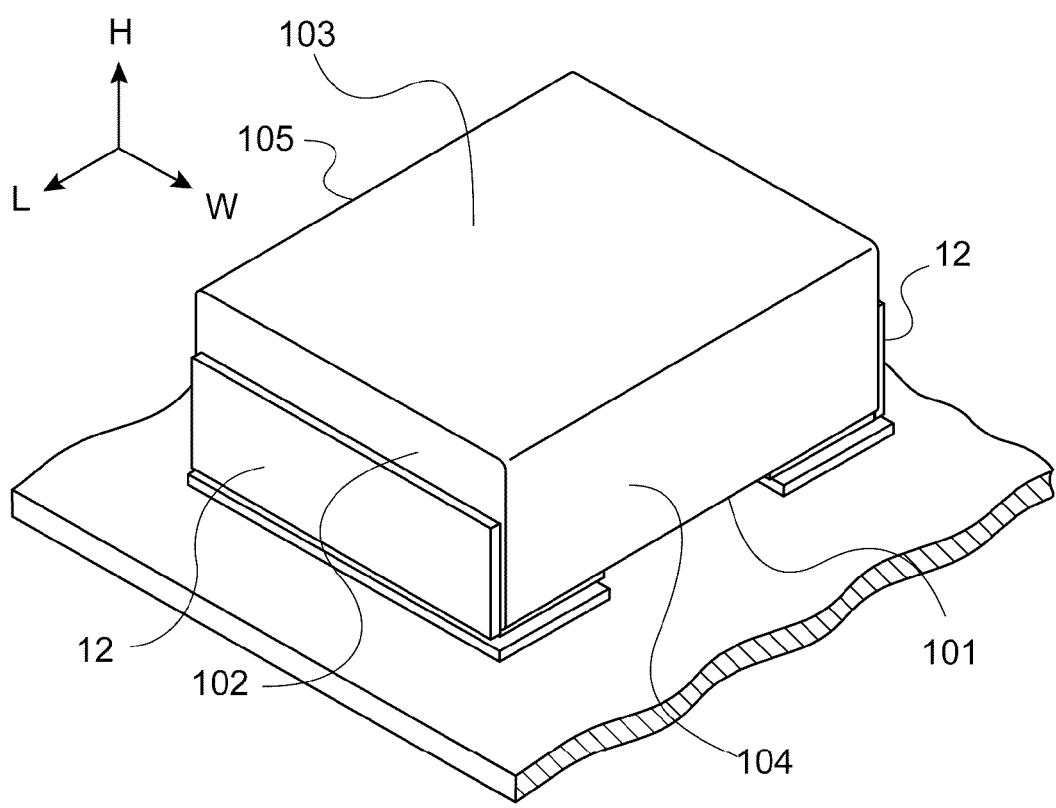
FIG. 5 is a perspective view showing another modification the external electrode.

FIG. 4 illustrates a modification to the external electrodes 12. FIG. 5 illustrates another modification to the external electrodes 12.

Each of the external electrodes 12 shown in FIG. 4 extends over each end surface 102 of the magnetic base body 11 and also extends to a certain area of the bottom surface 101 and to a certain area of the upper surface 103. However, each of the external electrodes 12 does not extend onto the front surface 104 or the rear surface 105.

Each of the external electrodes 12 shown in FIG. 5 extends over a certain area of each end surface 102 of the magnetic base body 11 and also extends to a certain area of the bottom surface 101. The external electrodes 12 shown in FIG. 5 do not extend onto the upper surface 103, the front surface 104, or the rear surface 105.

As described above, the external electrodes 12 are present on the end surfaces 102 and extend to the bottom surface 101. The external electrodes 12 may not extend onto the top surface 103, the front surface 104, and the rear surface 105. Even if the external electrodes 12 extend onto the top surface 103, the front surface 104 and/or the rear surface 105, the external electrodes 12 are present in a small and narrow area along the ridges, like a thin strip, of the end surfaces 102. In an alternative configuration, each of the external electrodes 12 may extend on a relatively large area of the front surface 104 and a relatively large area of the bottom surface 101. In another alternative configuration, each of the external electrodes 12 may extend on a relatively large area of the rear surface 105 and a relatively large area of the bottom surface 101.

Structure of External Electrode

The structure of the external electrodes 12 of the coil component 1 shown in FIGS. 1 to 3 will be described below in detail with reference to FIGS. 3, 6 and 7.

Each of the external electrodes 12 includes a first conductive resin layer 201 provided on the bottom surface 101, a second conductive resin layer 202 provided on the end surface 102, and a metal layer 203 that covers the first conductive resin layer 201 and the second conductive resin layer 202. The external electrode 12 may include a third conductive resin layer (not shown) in addition to the first conductive resin layer 201 and the second conductive resin layer 202.

Each of the first conductive resin layer 201 and the second conductive resin layer 202 is a conductive layer that contains a resin and metal particles. Each of the first conductive resin layer 201 and the second conductive resin layer 202 may contain an 80 wt % or more of a metal material, a 10 wt % or more of a resin, and other components. The metal material is metal grains containing Ag, Cu, Ni, and may include a ceramic material and a glass material. The conductive resin layers 201 and 202 are layers in which metal particles are bonded together by resin, and conductivity is obtained by the presence of portions in which the metal particles are in continuous contact with each other.

The metal particles used for the conductive resin layer 202 have a large particle size and a small particle size. The shapes of the metal particles are spherical, ovoid, plate-like, needle-like, etc. The particle size (particle diameter) of the metal particles is an average length of the longest portions measured in a direction having the largest dimensions of the particles. The longest portion may be large or small or in between, depending on the particle.

When an amount of resin is large in the conductive resin layers 201 and 202, a group of metal particles that contains a relatively large number of particles having relatively large longest portions are used. When an amount of resin is small in the conductive resin layers 201 and 202, a group of metal particles containing a relatively large number of particles having relatively small longest portions are used. For example, a particle having a large longest portion is a plate-like particle or a needle-like particle, and a particle having a small longest portion is a spherical particle or an oval particle. The longest portion of a metal particle need not be three-dimensionally longest, but may be longest in a cross section of the conductive resin layer 201, 202.

Each of the conductive resin layers 201 and 202 may be formed by combining particles having large longest portions and small (er) longest portions. For example, the first conductive resin layer 201 may be formed by combining plate-shaped particles, which have large longest portions, and spherical particles, which have small longest portions. The second conductive resin layer 202 may be formed by combining plate-shaped particles having small longest portions and spherical particles having large longest portions.

The particle size of the metal particles in the first conductive resin layer 201 (i.e., the average length of the longest portions) is preferably greater than the particle size of the metal particles in the second conductive resin layer 202. As a result, the resistance value of the first conductive resin layer 201 is lowered.

In this embodiment, the content rate of the resin in the first conductive resin layer 201 is higher than the content rate of the resin in the second conductive resin layer 202. Therefore, the first conductive resin layer 201 can reduce stress when compared to a configuration in which the content rate of the resin in the first conductive resin layer 201 is the same as the content rate of the resin in the second conductive resin layer 202. In this embodiment, in particular, stress generated by the metal layer 203 is relieved. In addition, a cushioning effect between the coil component 1 and the board 2a is also obtained in this embodiment.

For the metallic layer 203 formed over the first conductive resin layer 201 and the second conductive resin layer 202, a Ni layer is more likely to be a cause of stress than a Sn layer. By providing the first conductive resin layer 201 having a large proportion of resin, the effect of stress-reduction can be obtained, and thus, as the metallic layer 203, a sufficiently thick Ni layer can be used.

When the content rate of the resin in the first conductive resin layer 201 is 50 vol % or more, the effectiveness of stress-reduction in the first conductive resin layer 201 is further enhanced. The content rate of the resin in the first conductive resin layer 201 may be between 60 vol % and 75 vol %. The content rate of the resin in the second conductive resin layer 202 is preferably equal to or greater than 40 vol %, and may be between 50 vol % and 60 vol %.

Each of the first conductive resin layer 201 and the second conductive resin layer 202 has voids in addition to the metal particles and the resin. The second conductive resin layer 202 has a larger void content rate than does the first conductive resin layer 201. The second conductive resin layer 202 contains a larger number of metal particles having a smaller particle size than does the first conductive resin layer 201. As a result, in the second conductive resin layer 202, the metal particles having a small particle size are aggregated, so that a gaps (voids) are easily formed around the aggregations. That is, since the amount of resin is small and the specific surface area of the metal particles is large in the second conductive resin layer 202, voids constituted by relatively less resin are naturally formed in the second conductive resin layer 202. Since the second conductive resin layer 202 includes more voids than does the first conductive resin layer 201, the second conductive resin layer 202 also has a stress reduction effect. Therefore, the thickness of the second conductive resin layer 202 may be thinner (than the first conductive resin layer 201).

The metal layer 203 is made of a metal material having excellent conductivity. For example, Cu or Ag is used as the metal material of the metal layer 203. Alternatively, Ni, Pd, or Sn may be used as the metal material of the metal layer 203. The metal layer 203 has a multilayer structure, i.e., layers having the respective metallic materials as their main components are stacked, or layers having the respective metallic materials that are partially alloyed with each other are stacked. The metal layer 203 is formed by, for example, plating, coating of the metallic materials, sputtering, or vapor deposition.

The two external electrodes 12 are provided on the surface of the magnetic base body 11. The two external electrodes 12 are electrically connected to the two lead portions 401 of the conductor 14, respectively. Each of the external electrodes 12 has a layer that contains Sn. Each of the external electrodes 12 is connected to the associated lead portion 401 of the conductor 14 via the layer that contains Sn.

As shown in FIG. 3, in this embodiment, the connection between the conductor 14 and the external electrodes 12 is made between the lead portions 401 and the first conductive resin layers 201 on the bottom surface 101, and electrical conduction is obtained. In this configuration, electrical conduction is reliably maintained because the first conductive resin layer 201 having the effect of reducing stress (described later) is used.

Each of the external electrodes 12 may include an underlying (undercoating) electrode layer (not shown) between the first conductive resin layer 201 and the magnetic base body 11, and between the second conductive resin layer 202 and the magnetic base body 11. The underlying electrode layer may be formed of a metallic material such as Ag, Cu, Ti, or Ni. The underlying electrode layer is provided on the surface of the magnetic base body 11 by plating, coating of the metallic material, sputtering, or vapor deposition. The underlying electrode layer may have a thickness of 1um or less. A portion (or some portions) of the underlying electrode layer may be separated from the remaining portions of the underlying electrode layer.

In the configuration shown in FIG. 3, the first conductive resin layer 201 extends in an area of the bottom surface 101 close to the end surface 102. The second conductive resin layer 202 extends over the entire end surface 102 and extends to the respective ridge lines of the end surface 102. Since the second conductive resin layer 202 is present over the entire end surface 102, influence on the external dimensions of the coil component 1 is suppressed, and a contact area between the magnetic base body 11 and the external electrode 12 is increased so that adhesion between the magnetic base body 11 and the external electrode 12 is enhanced.

A lower end portion of the second conductive resin layer 202 extends to the bottom surface 101, and therefore the second conductive resin layer 202 covers a part of the first conductive resin layer 201 in the vicinity of the ridge between the bottom surface 101 and the end surface 102. This structure, i.e., the second conductive resin layer 202 covering a part of the first conductive resin layer 201 in the vicinity of this ridge, is preferable because the continuous external electrode 12 is formed even in the ridge area without increasing the thickness of the metal layer 203. It should be noted that the second conductive resin layer 202 may be in contact with the first conductive resin layer 201 without covering the first conductive resin layer 201, or the second conductive resin layer 202 may be spaced from the first conductive resin layer 201.

In the embodiments shown in FIGS. 1 to 3, an upper end portion of the second conductive resin layer 202 extends to the upper surface 103. Since a part of the second conductive resin layer 202 extends to the upper surface 103, influence on the external dimensions of the coil component 1 is suppressed, and the contact area between the magnetic base body 11 and the external electrode 12 is increased so that adhesion between the magnetic base body 11 and the external electrode 12 is enhanced. Further, the conductive resin layer 202 can withstand stress from a plurality of directions. Accordingly, durability of the second conductive resin layer 202 is improved.

In the embodiments shown in FIGS. 1 to 3, a front end portion of the second conductive resin layer 202 extends to the front surface 104 and a rear end portion of the second conductive resin layer 202 extends to the rear surface 105. The area of the part of the second conductive resin layer 202 extending to the upper surface 103 is 50% or less, or 25% or less, of the area of the first conductive resin layer 201 present on the bottom surface 101. The area of the part of the second conductive resin layer 202 extending to the front surface 104 is 50% or less, or 25% or less, of the area of the first conductive resin layer 201 present on the bottom surface 101. The area of the part of the second conductive resin layer 202 extending to the rear surface 105 is 50% or less, or 25% or less, of the area of the first conductive resin layer 201 present on the bottom surface 101.

Figure 6:
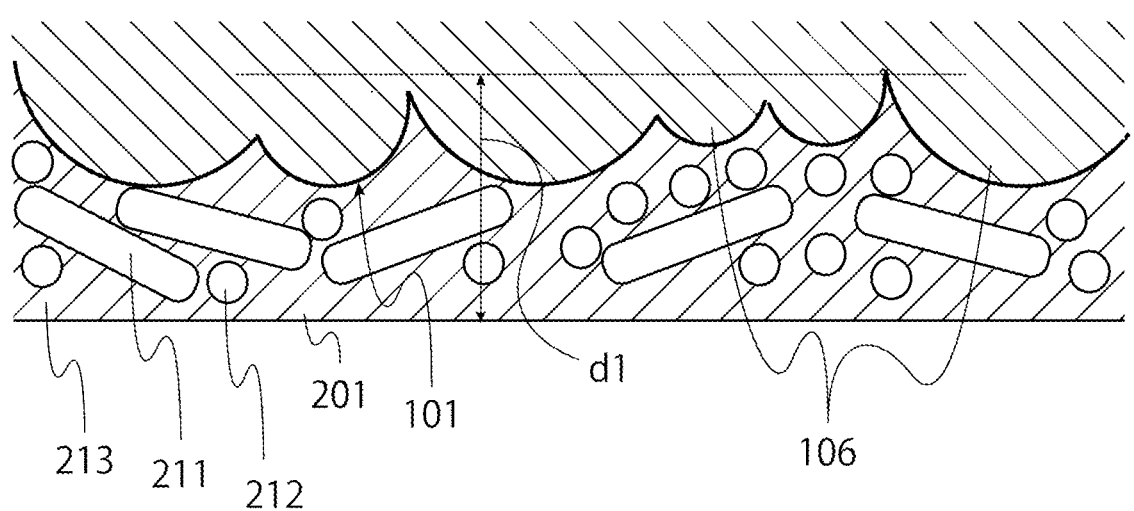
FIG. 6 is an enlarged view conceptually showing a microscopic structure of a first conductive resin layer.

FIG. 6 is an enlarged view that conceptually illustrates a microscopic structure of the first conductive resin layer 201. FIG. 7 is an enlarged view that conceptually illustrates a microscopic structure of the second conductive resin layer 202.

As shown in FIG. 6, on the bottom surface 11, there is a microscopically uneven structure caused by the metal magnetic particles 106. The first conductive resin layer 201 is provided on the uneven structure. As shown in FIG. 7, on the end surface 102, there is also a microscopically uneven structure caused by the metal magnetic particles 106. The second conductive resin layer 202 is provided on the uneven structure.

The thickness d1 of the first conductive resin layer 201 is greater than the thickness d2 of the second conductive resin layer 202. This relation of the thickness (d1>d2) provides a cushioning effect (shock absorbing effect) between the coil component 1 and the board 2a. In addition, the thickness relation of d1 being greater than d2 makes it possible to reduce the size of the coil component 1 without unnecessarily providing thickness for portions other than the bottom surface 101. The thickness d1 is a thickness in the H-axis direction, and the thickness d2 is a thickness in the L-axis direction. The greatest thickness in the first conductive resin layer 201 may be used as a representative value of the thickness d1, and the greatest thickness in the second conductive resin layer 203 may be used as a representative value of the thickness d2.

The presence and thickness of each of the layers in the external electrode 12 can be confirmed and known by observing the cross section of the external electrode 12 with an SEM (Scanning Electron Microscope) or the like. For example, the observation with the SEM can confirm the presence of the respective interfaces (contacting surfaces) that distinguish the magnetic base body 11, the conductor 14, the conductive resin layers 201, 202, and the metal layer 203 from each other. In addition, the respective layers in the external electrode 12 are distinguished from each other as the presence of metal, carbon, and oxygen is confirmed as a result of analyzing components in the layers with the SEM.

In this embodiment, the first conductive resin layer 201 includes first metal particles 211, second metal particles 212, and a resin portion 213. The particle size of the first metal particles 211 is different from the particle size of the second metal particles 212. The second conductive resin layer 202 includes third metal particles 221, fourth metal particles 222, and a resin portion 223. The particle size of the third metal particles 221 is different from the particle size of the fourth metal particles 222. Each of the first conductive resin layer 201 and the second conductive resin layer 202 also has void portions (not shown). Since the first metal particles 211 and the second metal particles 212 having different particle sizes are mixed in the first conductive resin layer 201, the conductivity of the conductive resin layer 201 is maintained. Since the third metal particles 221 and the fourth metal magnetic particles 222 having different particle sizes are mixed in the second conductive resin layer 202, the conductivity of the conductive resin layer 202 is maintained.

In the first conductive resin layer 201 illustrated in FIG. 6, the longest portion of the first metal particles 211 is longer than the longest portion of the second metal particles 212. In the second conductive resin layer 202 shown in FIG. 7, the longest portion of the third metal particles 221 is shorter than the longest portion of the fourth metal particles 222. As is understood from FIGS. 6 and 7, the longest portion of the first metal particles 211 in the first conductive resin layer 201 is longer than the longest portion of the third metal particles 221 in the second conductive resin layer 202. In addition, the longest portion of the second metal particles 212 in the first conductive resin layer 201 is shorter than the longest portion of the fourth metal particles 222 in the second conductive resin layer 202. The length of the longest portion in the first metal particles 211 is 5 µm to 20 µm, the length of the longest portion in the second metal particles 212 is 1 µm to 10 µm, the length of the longest portion in the third metal particles 221 is 1 µm to 5 µm, and the length of the longest portion in the fourth metal particles 222 is 0.1 µm to 0.5 µm.

Figure 7:
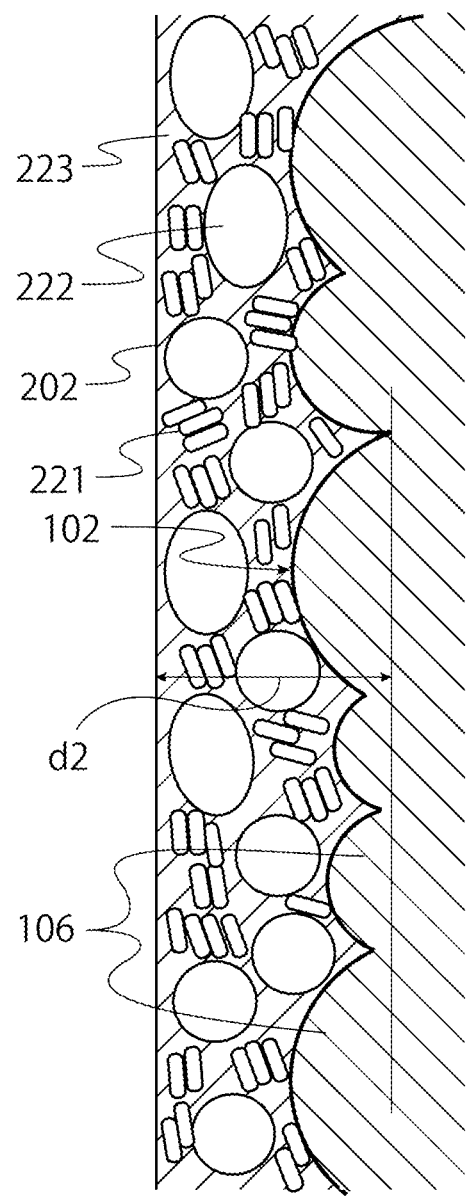
FIG. 7 is an enlarged view conceptually showing a microscopic structure of a second conductive resin layer.

In the example illustrated in FIGS. 6 and 7, the content rate of the resin portion 213 in the first conductive resin layer 201 is greater than the content rate of the resin portion 223 in the second conductive resin layer 202. The content rate of the resin portion 213 in the first conductive resin layer 201 may be a content rate of the resin portion 213 that overlaps a straight line extending in a direction orthogonal to the first conductive resin layer 201 (i.e., in the H-axis direction). The content rate of the resin portion 223 in the second conductive resin layer 202 may be a content rate of the resin portion 223 that overlaps a straight line extending in a direction orthogonal to the second conductive resin layer 202 (i.e., in the L-axis direction).

Each of the first metal particles 211 and the third metal particles 221 has a plane parallel to the longest portion, and has straight lines in its contour when viewed in cross section. Each of the second metal particles 212 and the fourth metal particles 222 does not have parallel planes to the longest portion, and has an arcuate profile when viewed in cross section. For example, each of the first metal particles 211 and the third metal particles 221 has a plate-like outer shape, and each of the second metal particles 212 and the fourth metal particles 222 has a spherical outer shape, an oval outer shape, or an ovoid outer shape (egg shape). Each of the first metal particles 221 has two parallel planes, and as shown in FIG. 7 a plurality of first metal particles 221 face each other at their planes. The longest portion of each of the first metal particles 221 is shorter than that of the fourth metal particles 222. As a plurality of first metal particles 221 contact each other, and this contact occurs at a plurality of locations in the second conductive resin layer 202, a plurality of aggregated portions (aggregated metal particles 221) are formed in the second conductive resin layer 202. When stress is applied to the first metal particles 221 which are aggregated in this manner, the first metal particles 221 slightly shift their positions from each other in the aggregation to reduce stress. Therefore, even if the thickness of the second conductive resin layer 202 is small, the second conductive resin layer 20 has a sufficient effect of stress reduction, which contributes to the downsizing of the coil component 1.

Manufacturing Process of Coil Component

A method of manufacturing the coil component 1 may include a step of forming the magnetic base body 11, a step of forming the conductor 14, and a step of forming the external electrodes 12 in this order, or may include a step of forming the magnetic base body 11, a step of forming the conductor 14, a step of forming certain portions of the external electrodes 12, and a step of forming remaining portions of the external electrodes 12 in this order.

Hereinafter, a method of manufacturing the metal composite-type coil component 1 will be described as a typical manufacturing method.

The metal composite-type coil component 1 includes a magnetic base body 11, and the base body 11 has a conductor 14 therein (i.e., the conductor 14 is embedded or encapsulated in a composite magnetic material, forming the base body 11). The composite magnetic material contains metal magnetic particles and resin. Subsequently, external electrodes 12 are provided on the magnetic base body 11. The conductor 14 may be a conductive wire having an insulating film thereon, or may be made by a process of plating a certain conductive material over an insulator.

The composite magnetic material undergoes a molding process (i.e., a pressurizing process and a heating process) to become a compact. The molding process causes the conductor 14 to be unified (integrated) with the composite magnetic material. The pressure in the molding process is, for example, 10 MPa to 100 MPa, and the temperature in the molding process is, for example, 100-200 degrees C. The compact is heated to 150 to 200 degree C., and the resin of the composite magnetic material is cured such that the compact becomes the magnetic base body 11.

The magnetic base body 11 is also subjected to a cutting process, a surface processing (machining) process, and the like, such that the end portions of the conductor 14 are exposed on the surface of the magnetic base body 11. The end portions of the conductor 14 are subjected to a surface treatment. For example, an etching process or a plasma process is applied to the end portions of the conductor 14 to remove dust, oxide, or the like from the end portions of the conductor 14. As a result, a desired metal surface, which is required for connection with the external electrode 12, is obtained at each of the end portions of the conductor 14.

A conductive paste is applied to the surface of the magnetic base body 11 on which the end portions of the conductor 14 are present, by screen printing, transfer, dipping, or the like. For example, the bottom surface 101 is provided with a conductive paste having a thickness of 10 µm to 30 µm by screen printing, and each of the end surfaces 102 is provided with a conductive paste having a thickness of 10 µm or less by transfer or dipping. A step of removing the excess conductive paste may be carried out to adjust the thickness of the applied paste.

The conductive paste provided on the bottom surface 101 and each of the end surfaces 102 is subjected to, for example, a heat treatment at a low temperature to form the first conductive resin layer 201 and the second conductive resin layer 202. The conductive paste provided on the bottom surface 101 is sufficiently thick so that the thickness d1 of the first conductive resin layer 201 becomes greater than a surface roughness Ra1 of the bottom surface 101.

The conductive paste provided on the bottom surface 101 and the end surfaces 102 is, for example, a conductive paste having different resin content rates. Specifically, the content rate of the resin in the conductive paste used for the bottom surface 101 is higher than the content rate of the resin in the conductive paste used for the end surfaces 102. As a result, the first conductive resin layer 201 and the second conductive resin layer 202 having the different resin content rates are obtained.

The particle size(s) of the metal particles contained in the conductive paste provided on the bottom surface 101 may be different from the particle size(s) of the metal particles contained in the conductive paste provided on each of the end surfaces 102 in order to adjust the thickness of the conductive paste on the bottom surface 101 and the thickness of the conductive paste on each of the end surfaces 102. For example, in order to make the thickness of the conductive paste small, a particle size corresponding to (or based on) the surface roughness Ra of the magnetic base body 11 may be used. That is, by using a conductive paste containing metallic particles having a particle size smaller than the surface roughness Ra, it is possible to obtain a conductive paste whose thickness corresponds to the unevenness of the surface of the magnetic base body 11. In particular, when the proportion of metal particles having a particle size of 1 μm or less is high, the thickness of the conductive paste becomes small.

If the conductive paste is applied to the entire surface of each of the end surfaces 102 by a transfer process or the like, the wet conductive paste is likely to spread on the neighboring surfaces of the end surface 102 (i.e., the upper surface 103, the front surface 104, and the rear surface 105). Thus, if the conductive paste is applied to the entire surface of each of the end surfaces 102 by a transfer process or the like, the conductive paste on the end surface 102 can have a small thickness, and the conductive paste is provided on only a small area of each of the corresponding surfaces (e.g., like a strip).

It should be noted that before the conductive paste is applied on the above-mentioned surfaces, an underlying electrode layer may be provided on any of the surfaces by plating or sputtering. When the underlying electrode layer is provided, the thickness of the conductive paste can further be reduced. In other words, even if the thickness of the conductive paste is further reduced, the metal layer 203 can still subsequently be formed on the entire necessary portion(s).

After the first conductive resin layer 201 and the second conductive resin layer 202 are obtained in the above-described manner, the metal layer 203 is formed over the first conductive resin layer 201 and the second conductive resin layer 202 on each of the end surfaces 102 and the neighboring surfaces by, for example, plating, coating with a metal material, sputtering, or vapor deposition.

With the above-described manufacturing method, the external electrodes 12 each including the first conductive resin layer 201 and the second conductive resin layer 202 having the structures illustrated in FIGS. 6 and 7 are obtained, and the manufacturing of the coil component 1 illustrated in FIGS. 1 to 3 is completed.

Figure 8:
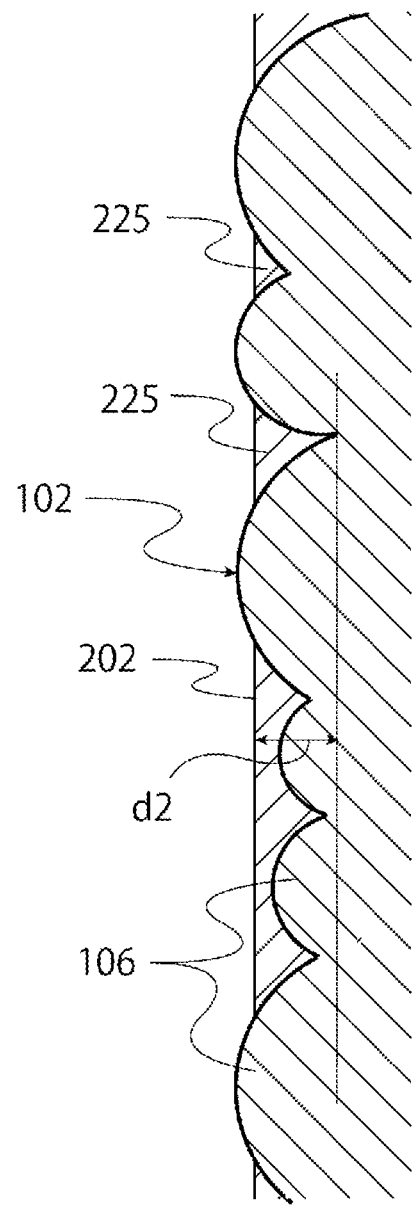
FIG. 8 is an enlarged view conceptually showing a microscopic structure of a modification to the second conductive resin layer.

FIG. 8 is similar to FIG. 7 and shows an enlarged view that conceptually illustrates a microscopic structure of a modification to the second conductive resin layer 202. In FIG. 8, the metal particles in the second conductive resin layer 202 are not shown.

In the modification shown in FIG. 8, the second conductive resin layer 202 is separated into a plurality of layer portions 225 when viewed in cross section. The cross section may be at least one cross section taken in the L-axis direction (in the thickness direction of the second conductive resin layer 202). In other words, the cross section may be at least one cross section taken in a direction perpendicular to an outer surface or an inner surface (back surface) of the second conductive resin layer 202. The layer portions 225 separated from each other may be present in a plurality of grooves, notches and/or holes. It should be noted that when the layer portions 225 are looked at in other cross sections, the layer portions 225 may be connected to each other around the groove(s), notch(es) and hole(s), i.e., "separated into a plurality of layer portions 225" may only be true when viewed in a particular cross section of the second conductive resin layer 202.

In the configuration illustrated in FIG. 8, the convex portion in the uneven structure of the end surface 102 protrudes from the inner surface side of the second conductive resin layer 202 toward the outer surface side such that the layers portion 225 are isolated from each other by the convex portion. In other words, the concave portion in the uneven structure of the end surface 102 forms a plurality of grooves, notches and/or holes that receive the second conductive resin layers 202 which are divided by the convex portion into the layer portions 225. It should be noted that a gap or a void may be formed between each two adjacent layer portions 225, or the metal layer 203 may extend inward from the outer surface side to the inner surface side of the second conductive resin layer 202 such that the extending portions of the metal layer 203 separate the second concave resin layer 202 into a plurality of layer portions 225.

As the second conductive resin layer 202 is separated into a plurality of layer portions 225 when viewed in one or more cross sections in the L-axis direction, the thickness d2 of the second conductive resin layer 202 becomes smaller, and therefore the second conductive resin layer 202 does not protrude extremely from the external dimension of the magnetic base body 11 in the L-axis direction. Consequently, the thickness of each of the external electrodes 12 becomes thinner. Further, stress generated in the second conductive resin layer 202 is reduced, and stress received from the metal layer 203 to the second conductive resin layer 202 is dispersed.

The metal layer 203 has a high metal filling ratio. Due to the presence of the metal layer 203 having a high filling ratio of the metal, the shape of the external electrode 12 is maintained in a stable manner with fewer defects when the coil component 1 is mounted on the board 2a.

The second conductive resin layer 202, which is separated into the layer portions 225, can be realized by adding an adjustment step of reducing the thickness of the conductive paste to (in) the step of providing the conductive paste on the end surfaces 102. That is, as the adjustment step (i.e., the step of making the thickness of the conductive paste smaller than the surface roughness Ra2 of the end surface 102) is carried out, a portion where metallic grains of the conductive paste are present and a portion where metallic grains are not present are formed.

As a result of carrying out the adjustment step, the second conductive resin layer 202 obtained from the conductive paste has grooves, holes, and/or notches such that the second conductive resin layer 202 is separated into a plurality of layer portions 225 when viewed in one or more cross sections in the L-axis direction. It should be noted that the conductive paste provided on each of the end surfaces 102 may have a thickness smaller than the surface roughness Ra2 of the end surface 102 if the conductive paste is provided directly by printing or the like, without carrying out the adjustment step of adjusting the thickness of the conductive paste.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed:

1. A coil component comprising: a magnetic base body, which includes metal magnetic particles bonded together by a first resin, the magnetic base body having a first surface that faces a board when the coil component is mounted on the board, and having a second surface that is immediately adjacent to the first surface; a conductor provided inside and/or on a surface of the magnetic base body; and an external electrode electrically connected to the conductor, the external electrode including: a first conductive resin layer provided on the first surface of the magnetic base body, the first conductive resin layer being a layer made of a conductive material that contains a second resin and first metal particles, the second resin being an entire resin contained in the first conductive resin layer, a second conductive resin layer provided on the second surface of the magnetic base body, the second conductive resin layer being a layer made of a conductive material that contains a third resin and second metal particles, the third resin being an entire resin contained in the second conductive resin layer, a content rate of the third resin contained in the second conductive resin layer being smaller than a content rate of the second resin contained in the first conductive resin layer, and a metal layer covering and contacting the first conductive resin layer on the first surface, and the second conductive resin layer on the second surface, wherein the first conductive resin layer has voids, the second conductive resin layer has voids, and a volume rate of the voids in the second conductive resin layer is greater than a volume rate of voids in the first conductive resin layer.

2. The coil component according to claim 1, wherein the first conductive resin layer is thicker than the second conductive resin layer.

3. The coil component according to claim 1, wherein the content rate of the second resin in the first conductive resin layer is 50 vol % or more.

4. The coil component according to claim 1, wherein an average length of longest portions of the first metal particles in the first conductive resin layer is greater than an average length of longest portions of the second metal particles in the second conductive resin layer.

5. The coil component according to claim 1, wherein the second conductive resin layer is separated into a plurality of portions when viewed in at least one cross section taken in a thickness direction of the second conductive resin layer.

6. The coil component according to claim 1, wherein a portion of the second conductive resin layer extends to the first surface and covers a portion of the first conductive resin layer.

7. The coil component according to claim 1, wherein the second conductive resin layer extends over the entire second surface and extends to ridges of the second surface.

8. The coil component according to claim 1, wherein the magnetic base body has a third surface, which is an opposite surface to the first surface, and a portion of the second conductive resin layer extends to the third surface.

9. A circuit board arrangement comprising: a coil component recited in claim 1; and a board on which the coil component is mounted.

10. An electronic device comprising the circuit board arrangement recited in claim 9.

11. A method of manufacturing the coil component of claim 1, the coil component including the metallic base body, the conductor, and the external electrode, the external electrode having the first conductive resin layer, the second conductive resin layer, and the metal layer, the method comprising: forming the first conductive resin layer with a first conductive paste, the first conductive paste containing the second resin and the first metal particles; forming the second conductive resin layer with a second conductive paste, the second conductive paste containing the third resin and the second metal particles, and the content rate of the third resin contained in the second conductive paste being smaller than the content rate of the second resin contained in the first conductive paste; and forming the metal layer.

* * * * *